United States Patent
Yang

(10) Patent No.: US 7,306,955 B2
(45) Date of Patent: Dec. 11, 2007

(54) METHOD OF PERFORMING A DOUBLE-SIDED PROCESS

(75) Inventor: Chen-Hsiung Yang, Taipei Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 43 days.

(21) Appl. No.: 11/277,350

(22) Filed: Mar. 23, 2006

(65) Prior Publication Data

US 2007/0111472 A1   May 17, 2007

(30) Foreign Application Priority Data

Nov. 11, 2005   (TW) ............................. 94139788 A

(51) Int. Cl.
*H01L 21/00* (2006.01)

(52) U.S. Cl. .................... 438/9; 438/706; 438/745; 438/743; 257/E21.229; 257/E21.304; 257/E21.257

(58) Field of Classification Search ............... 438/9, 438/8, 401, 455, 637, 706, 733, 734, 743, 438/692, 513, 942
See application file for complete search history.

(56) References Cited

U.S. PATENT DOCUMENTS 4,761,881 A * 8/1988 Bora et al. ................... 29/840
5,137,618 A * 8/1992 Burnett et al. ............... 205/125
5,242,863 A * 9/1993 Xiang-Zheng et al. ........ 438/53
5,582,678 A * 12/1996 Komuro ....................... 216/27
5,665,249 A   9/1997 Burke et al.
7,235,185 B2 * 6/2007 Chen ........................... 216/88
2006/0030120 A1   2/2006 Shao et al.

FOREIGN PATENT DOCUMENTS

| TW | 1220423 B | 8/2004 |
|---|---|---|
| TW | 1236058 B | 7/2005 |
| TW | 1239057 B | 9/2005 |
| WO | WO 03/020634 A2 | 3/2003 |

* cited by examiner

*Primary Examiner*—David Nhu
(74) *Attorney, Agent, or Firm*—Winston Hsu

(57) ABSTRACT

A method of performing a double-sided process is provided. First, a wafer having a structural pattern disposed on the front surface is provided. Following that, a plurality of front scribe lines are defined on the structural pattern, and a filling layer is filled into the front scribe lines. Subsequently, the structural pattern is bonded to a carrier wafer with a bonding layer, and a plurality of back scribe lines are defined on the back surface of the wafer. Finally, the filling layer filled in the front scribe lines is removed.

13 Claims, 13 Drawing Sheets

METHOD OF PERFORMING A DOUBLE-SIDED PROCESS

BACKGROUND OF THE INVENTION

1. Field of the Invention

The present invention relates to a method of performing a double-sided process, and more particularly, to a method of performing a double-sided process, which effectively protects a structural pattern on a front surface of the wafer.

2. Description of the Prior Art

Micro-electromechanical components, for example, pressure sensors or microphones, have more complex mechanically designed structures than conventional semiconductor components, such as hanged membrane structures, and require a double-sided process for manufacturing. The steps of the double-sided process are complex, so the manufacture has many difficulties. The hanged membrane structure of micro-electromechanical components is frail, so rupture occurs easily as the cutting process is performed. Furthermore, the front structure of the wafer can be easily damaged as the back process is performed.

In general, the cutting process of the micro-electromechanical components is performed after the front and back processes are completed, and the cutter cuts the wafer to a plurality of dies. Utilizing the cutter to perform the cutting process has the following problems:

(1) 100 µm is the limit of the cutting width of the cutter. As the size of the components becomes smaller, the integration of the wafer cannot increase as it is affected by the size of the scribe lines;

(2) As the integration of the wafer increases, the cycle time of the cutting process increases to affect yield;

(3) Utilizing the cutter produces many fractures, and the wafer needs to perform a clean process using clean liquid; however, the frail hanged membrane structure fractures more easily during the clean process.

The cutting process of the prior art can also use an etching process as well as the cutter. Please refer to FIGS. 1-3. FIGS. 1-3 are schematic diagrams of a method of a cutting process performed by an etching process according to the prior art. As FIG. 1 shows, a wafer 10 is provided, and a sacrificial layer 12 and a structure layer 14 are formed on the front surface of the wafer 10. Then, a photoresist pattern 16 is formed on the surface of the structure layer 14. The photoresist pattern 16 is a hard mask for an etching process, so as to define front scribe lines 18 on the front surface of the wafer 10.

As FIG. 2 shows, the photoresist pattern 16 is removed, and the wafer 10 is turned over. The structure layer 14 is connected with a carrier wafer 22 by a bonding layer 20. Subsequently, the other photoresist pattern 24 is formed on the back surface of the wafer 10. The photoresist pattern 24 is a hard mask for a dry etching process in order to define back scribe lines 26 and a chamber 28 of micro-electromechanical components. As FIG. 3 shows, the photoresist pattern 24 is removed, and a wet etching process is performed to remove the sacrificial layer 12, so as to form a hanged membrane structure 30.

As the prior art utilizes the wet etching process to remove the sacrificial layer 12, if the material of the bonding layer 20 and that of the sacrificial layer 12 have poor etching selectivity, the etching liquid will corrode the front surface of the structure layer 14 during the etching process, and the hanged membrane structure 30 will be damaged. Utilizing another method, even if the bonding layer 20 is selected to have a better protection ability, the hanged membrane structure 30 will still fracture, because of the stress caused from the bonding layer 20 stacked on itself.

SUMMARY OF THE INVENTION

It is therefore one objective of the present invention to provide a double-sided process method, which effectively protects a structural pattern when processed on a front surface of the wafer.

According to the claimed invention a method is provided of performing a double-sided process. First, a wafer is provided, the front surface of the wafer having a structural pattern. Then, a plurality of front scribe lines are defined on the structural pattern, and a filling layer is filled into the front scribe lines. Subsequently, the structural pattern is bonded to a carrier wafer with a bonding layer, and a plurality of back scribe lines are defined on the back surface of the wafer. Finally, the filling layer filled in the front scribe lines is removed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
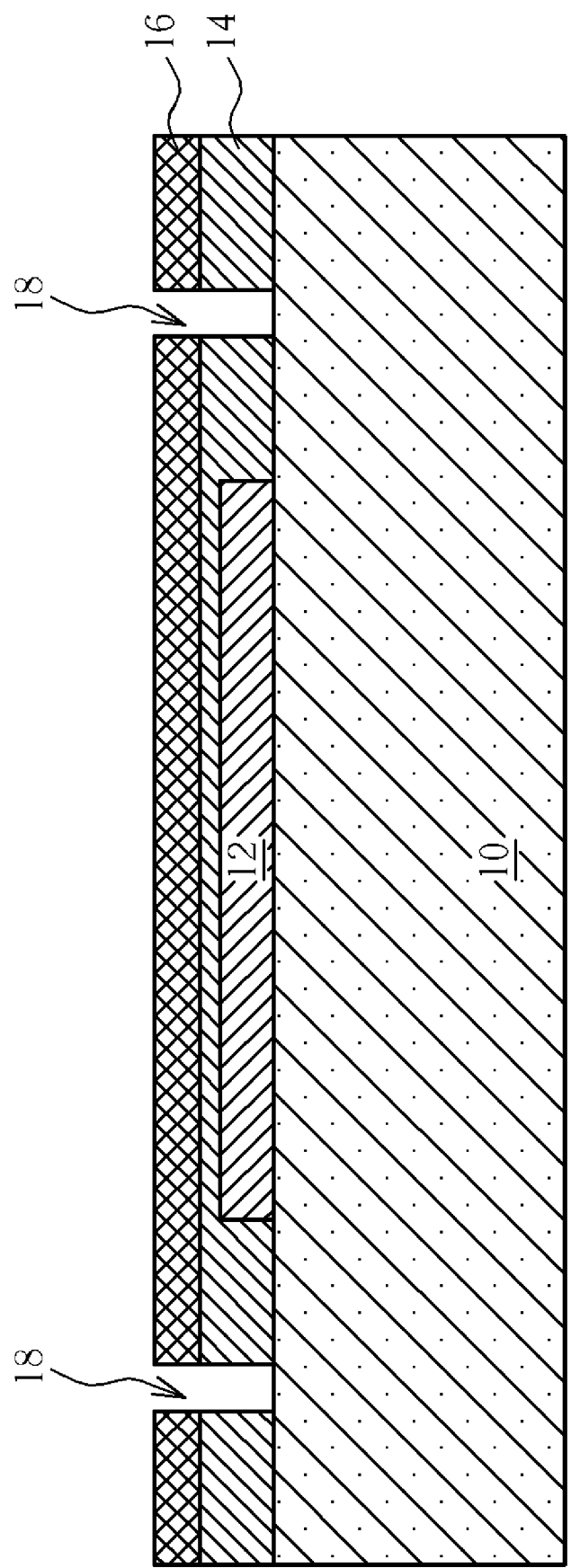
FIGS. 1-3 are schematic diagrams of a cutting process method performed by an etching process according to the prior art.
Figure 2:
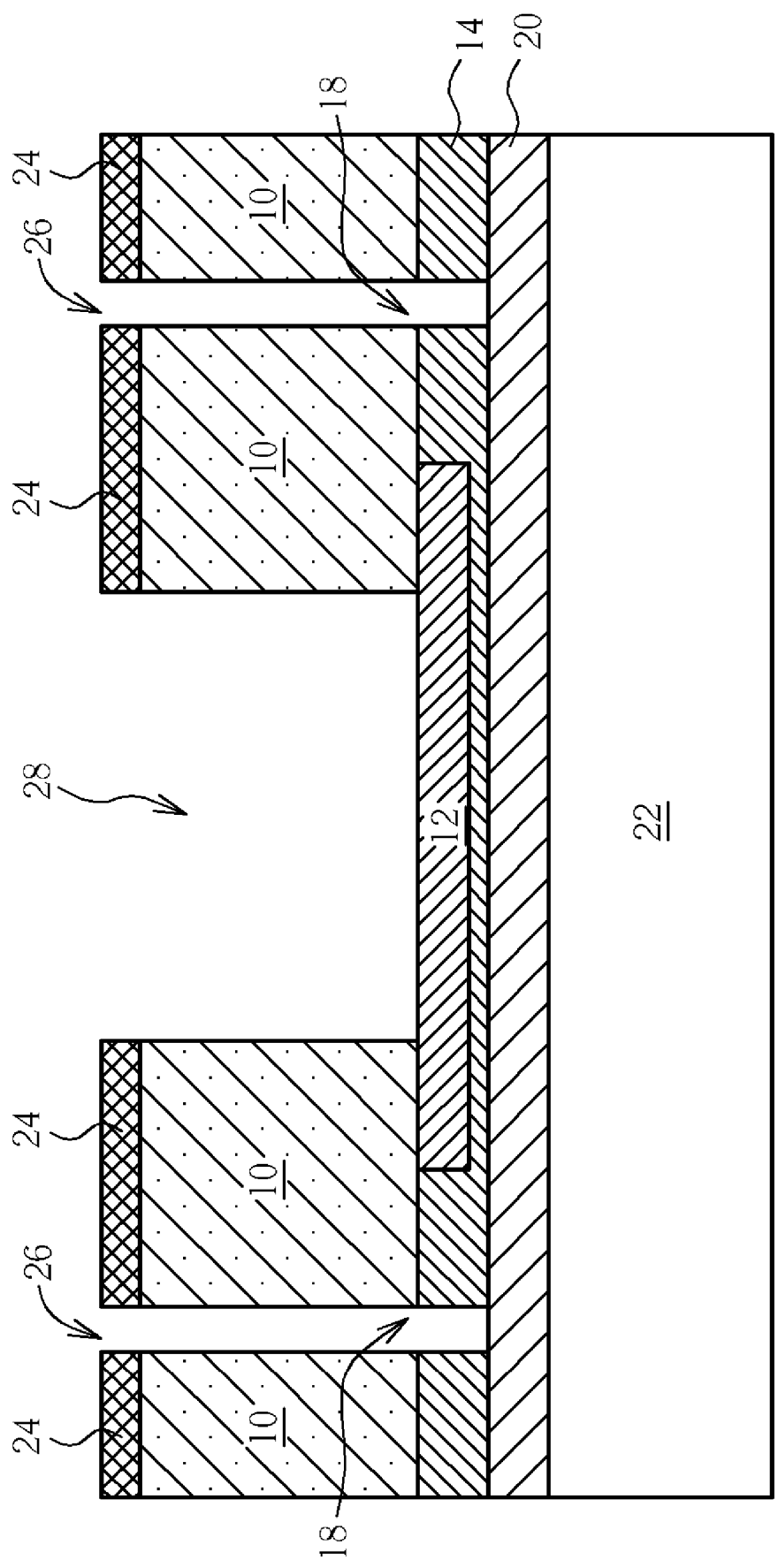
Figure 3:
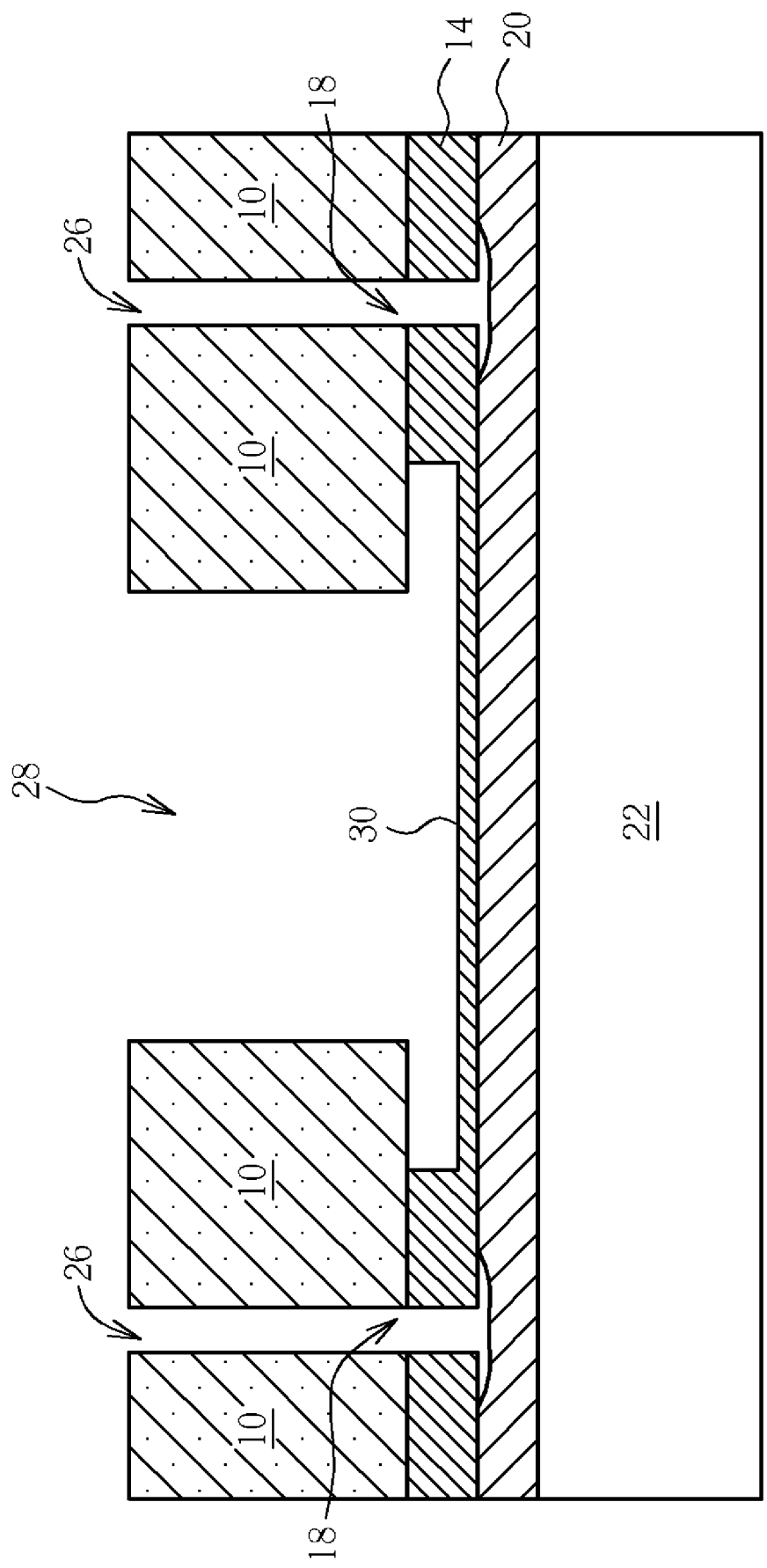
Figure 4:
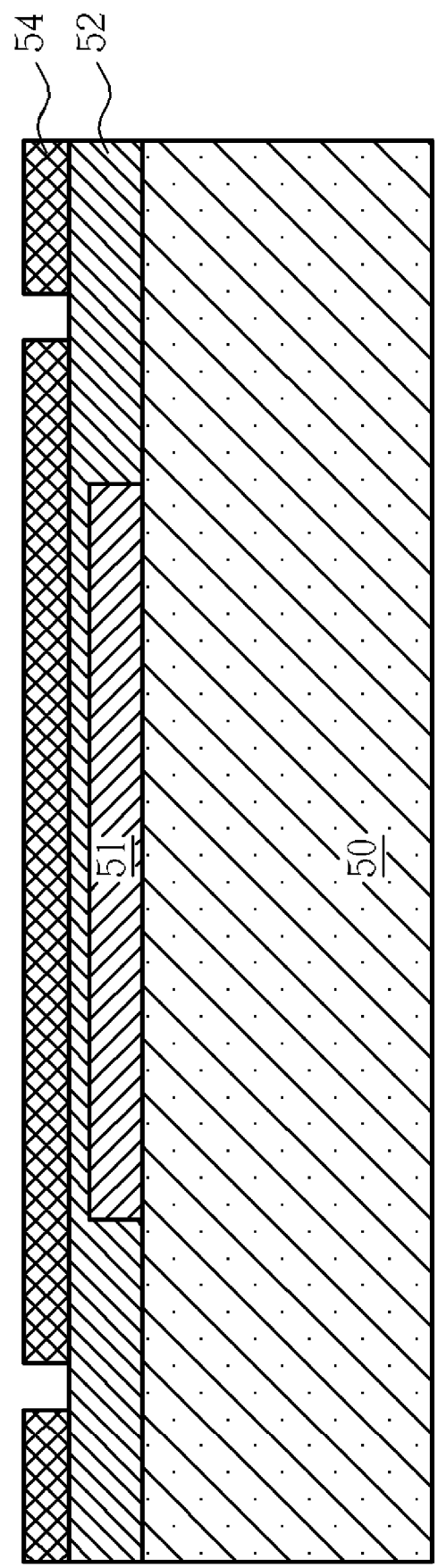
FIGS. 4-13 are schematic diagrams of a double-sided process method according to the present invention.

Please refer to FIGS. 4-13. FIGS. 4-13 are schematic diagrams of the double-sided process method according to the present invention. As FIG. 4 shows, firstly a wafer 50 is provided, the front surface of the wafer 50 including a structural pattern 52, wherein the structural pattern 52 has different structures depending on the manufacture of different components. The embodiment takes a hanged membrane structure as an example. Therefore, the wafer 50 further includes a sacrificial layer 51 (e.g. a silicon dioxide layer) between the structural pattern 52 and the wafer 50. Then, a mask pattern 54 (e.g. a photoresist pattern) is formed on the structural pattern 52.

Figure 5:
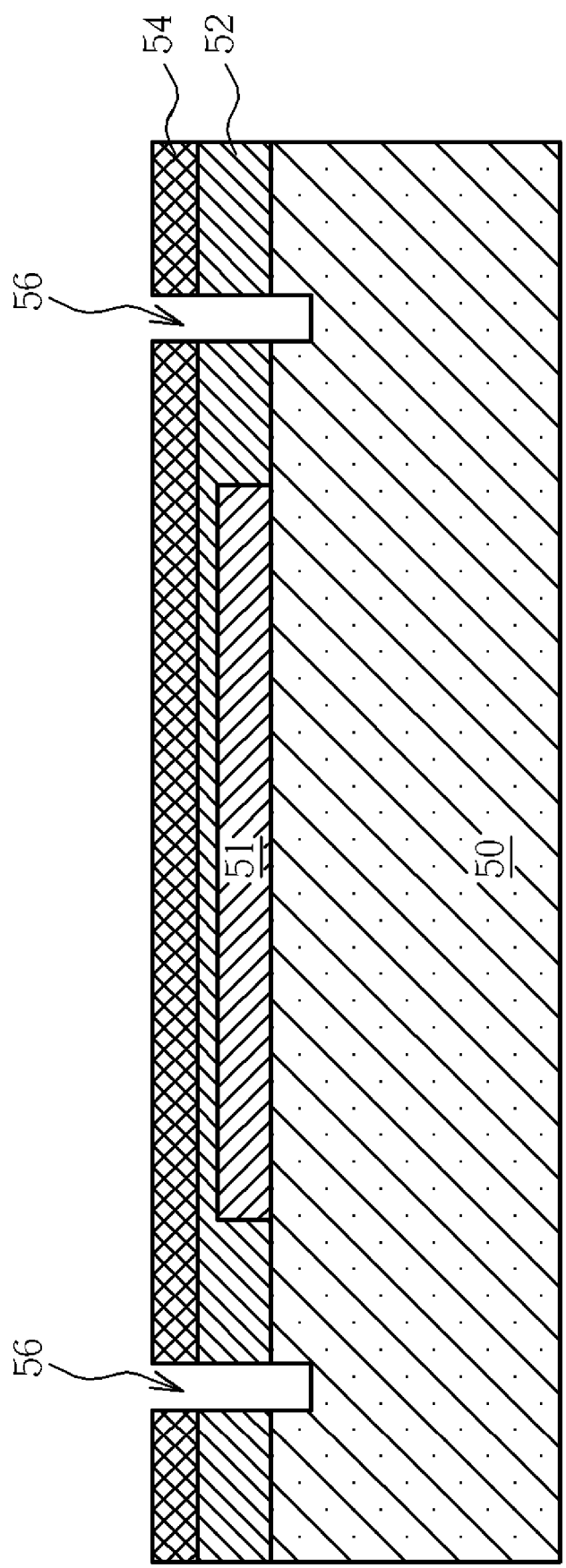
Figure 6:
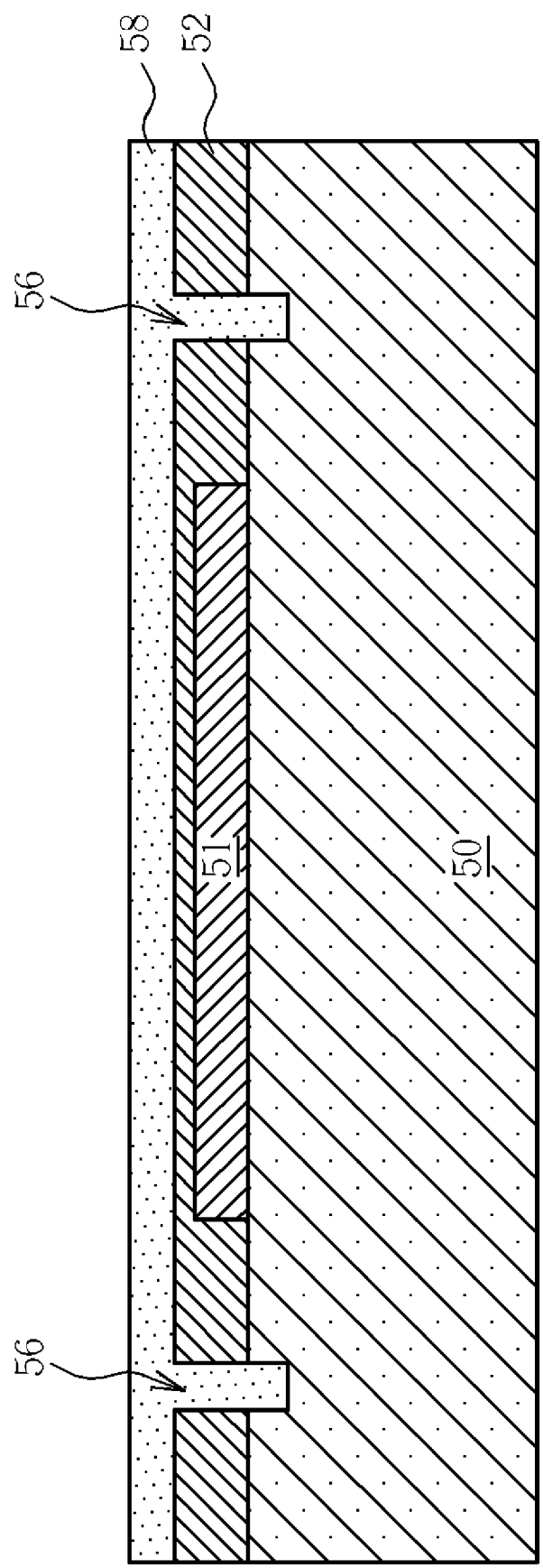
Figure 7:
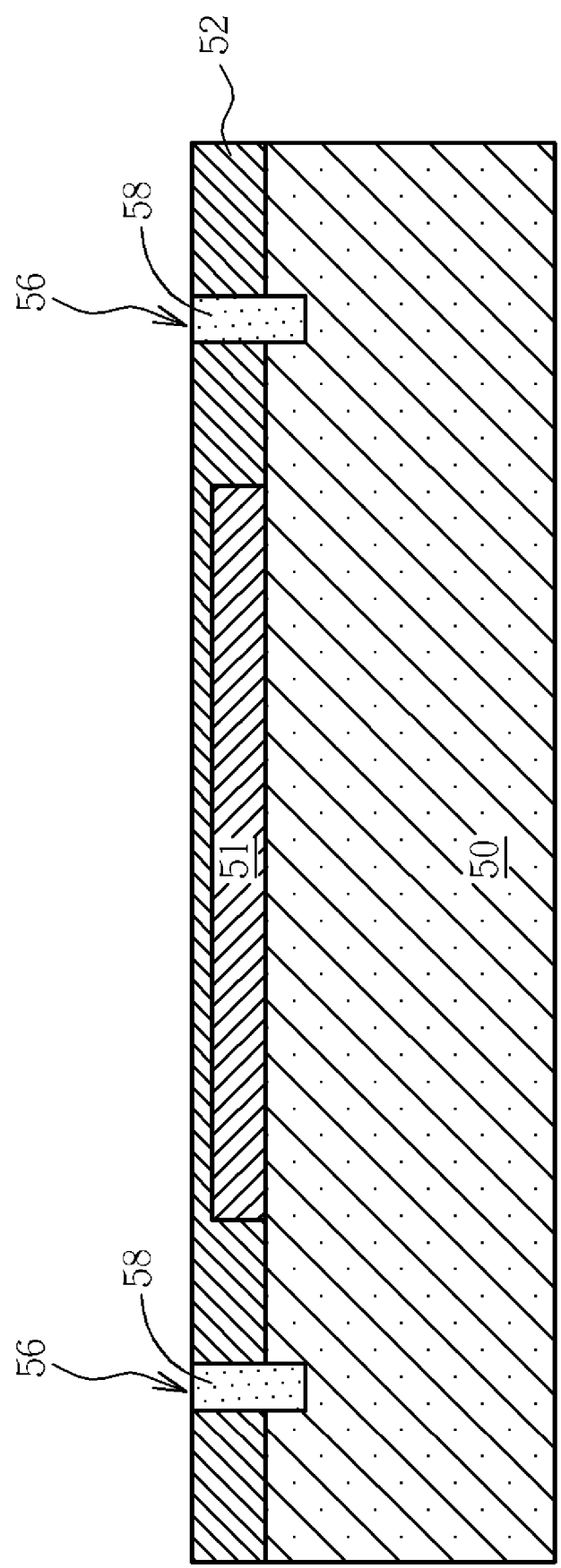

As FIG. 5 shows, a front etching process is performed subsequently, so as to define the front scribe lines 56 in the structural pattern 52, wherein the depths of the front scribe lines 56 can reach the structural pattern, or reach the wafer 50 without going through the wafer 50. As FIG. 6 shows, the mask pattern 54 is removed, a filling layer 58 is formed on the surface of the structural pattern 52, and the filling layer 58 is filled in the front scribe lines 56. The material of the filling layer 58 could be photoresist, BCB, polyimide, or epoxy, but is not limited to these materials. As FIG. 7 shows, the filling layer 58 on the surface of the structural pattern 52 is removed. The method of removing the filling layer 58 could utilize a wet process (e.g. using an organic solvent) or a dry process (e.g. oxygen plasma or polish) etc. However, the method of filling the front scribe lines 56 is not limited to the above-mentioned methods. The filling layer 58 can be filled in the front scribe lines 56 directly depending on the characteristics of the materials.

Figure 8:
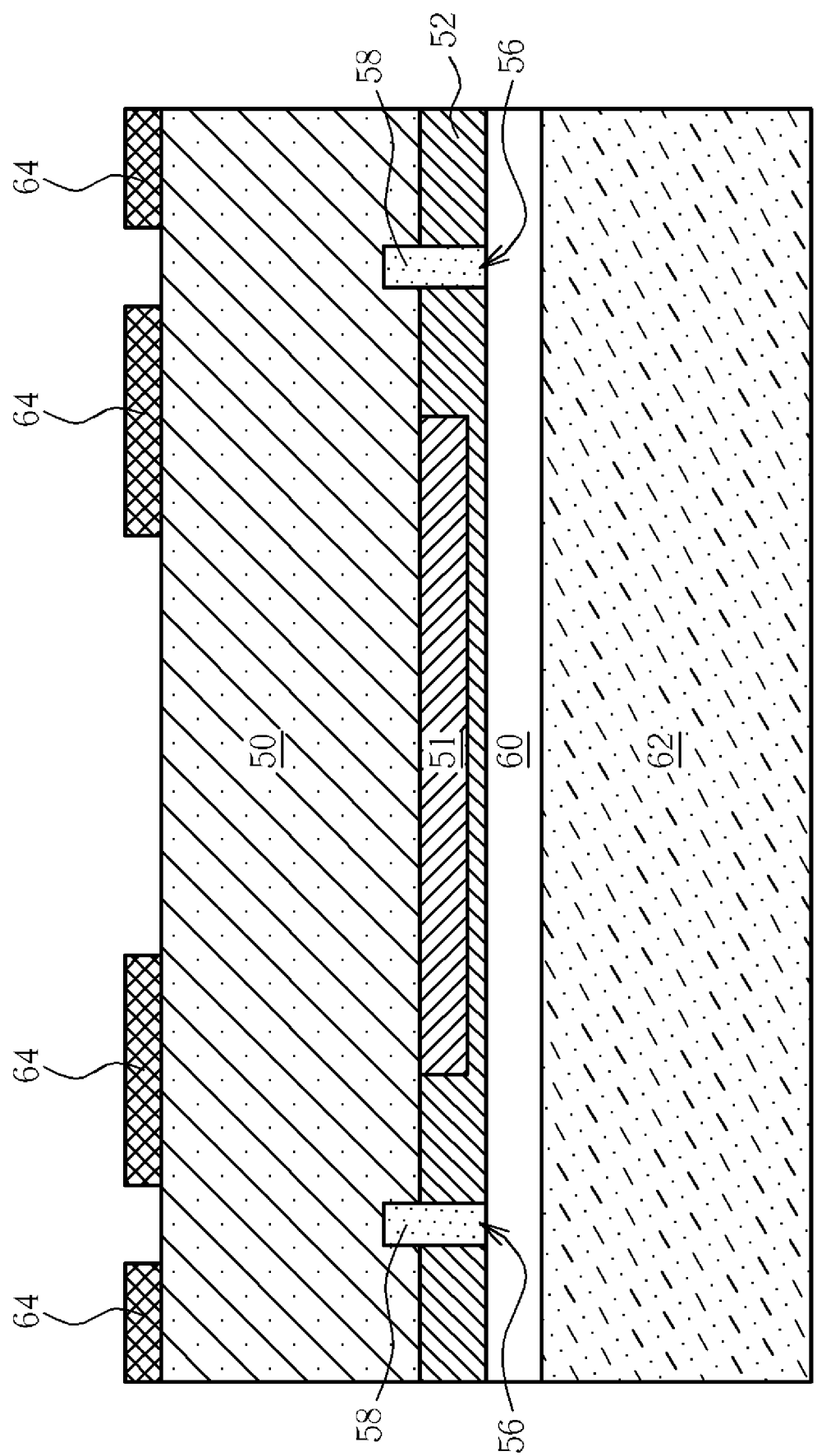

As FIG. 8 shows, the wafer 50 is turned over, and a bonding layer 60 is utilized to connect the structural pattern 52 with a carrier wafer 62, wherein the bonding layer 60 is a thermal releasing tape, a UV tape, etc. The bonding layer 60 can therefore be removed easily without damaging the structural pattern 52 due to stress problem. The material of the bonding layer 60, however, is not limited to the above-mentioned, and could be any suitable material. Subsequently, the other mask pattern 64 is formed on the back surface of the wafer 50, e.g. a photoresist, wherein the mask pattern 64 exposes the positions of the desired back scribe lines and the chamber to be formed.

Figure 9:
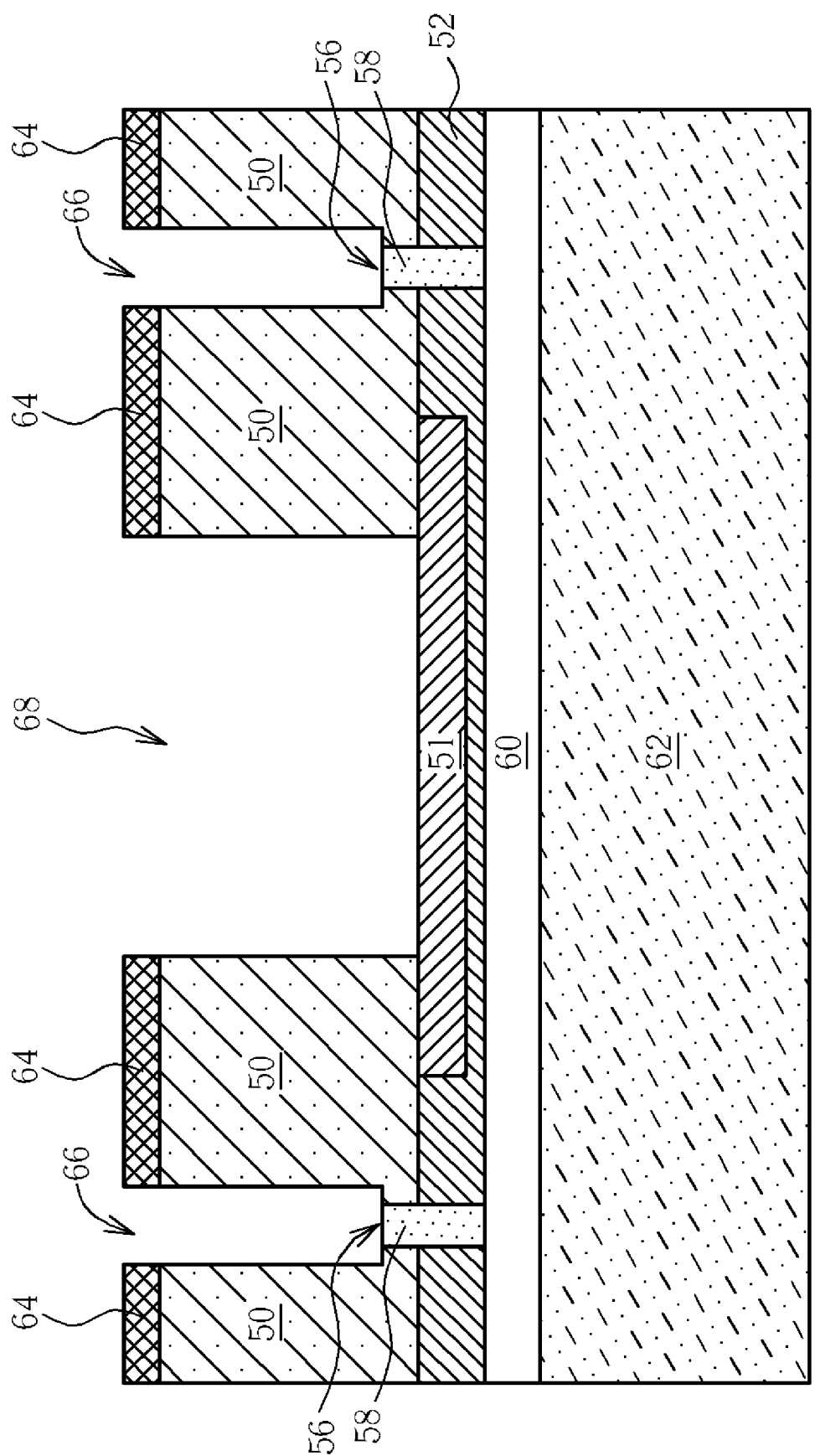

As FIG. 9 shows, the mask pattern 64 is utilized as a hard mask, and a back etching process is performed to define the back scribe lines 66 and the chamber 68, wherein the position of the back scribe lines 66 corresponds to the position of the front scribe lines 56, and the position of the chamber 68 corresponds to the position of the hanged membrane structure, which will be formed in the continuous manufacture. Furthermore, the back etching process could use a dry etching process, e.g. a plasma etching process, or a wet etching process, for example, utilizing potassium hydroxide (KOH) solution, ethylenediamine-pyrocatechol-water (EDP) solution, or tetramethyl ammonium hydroxide (TMAH) solution.

Figure 10:
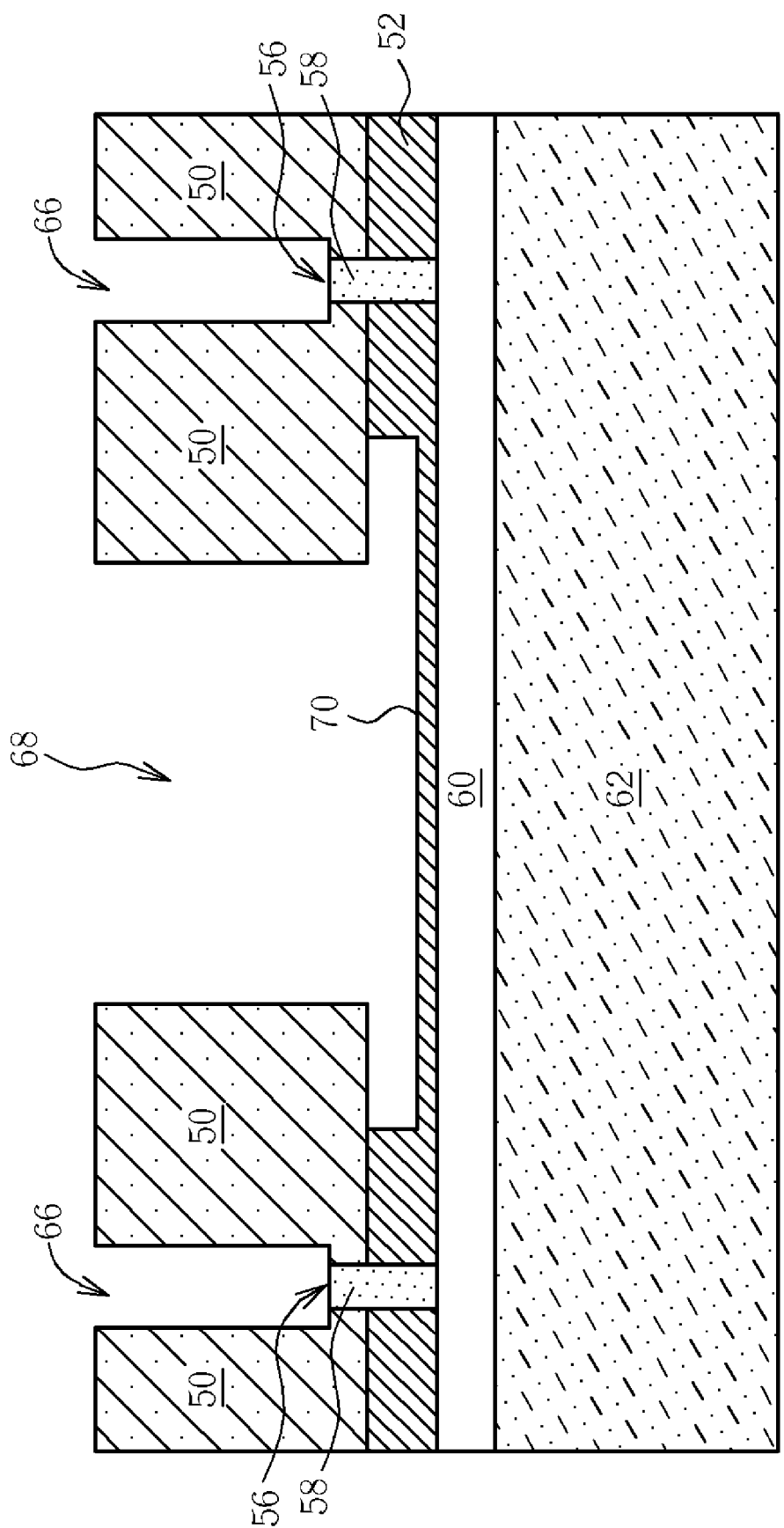
Figure 11:
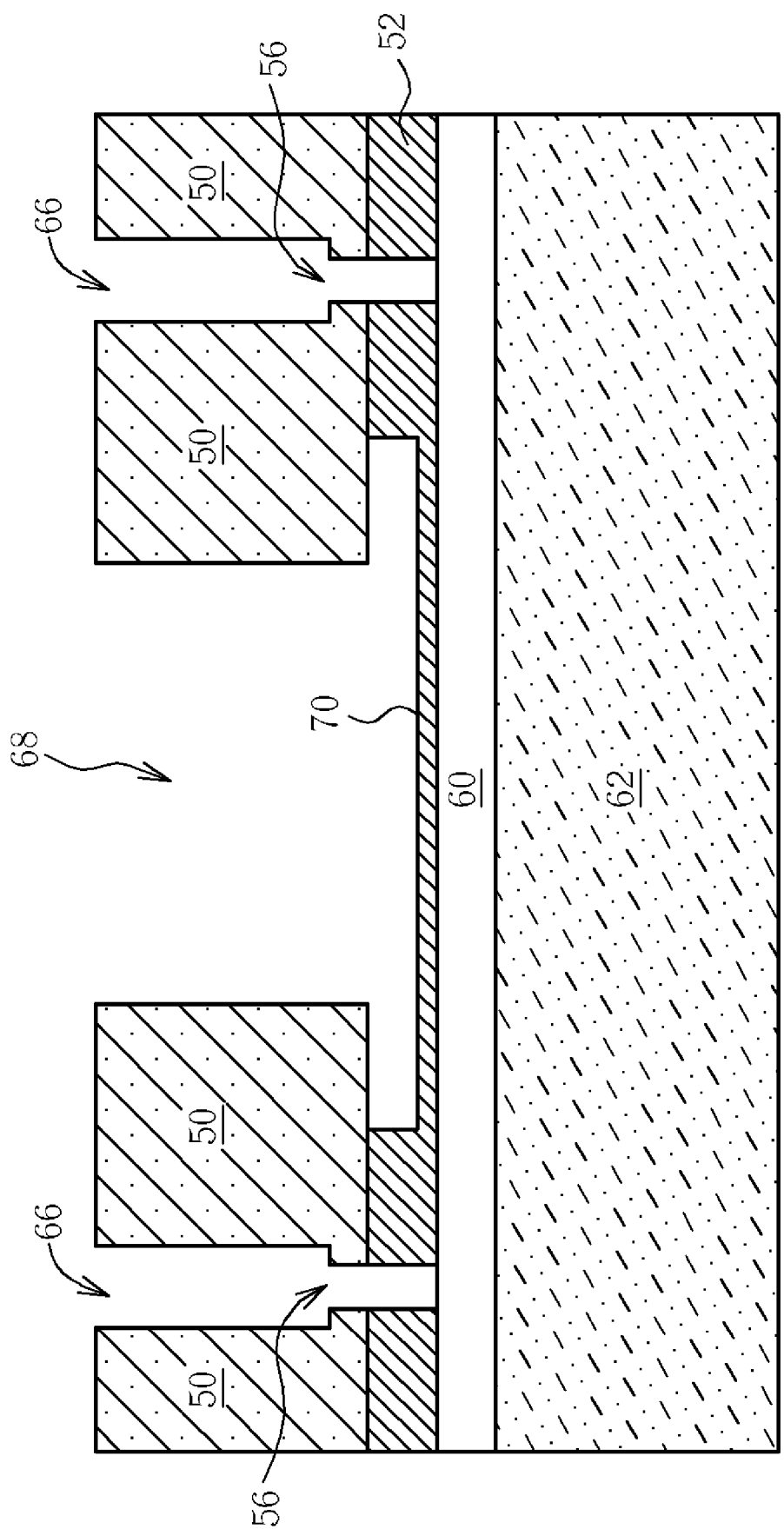

As FIG. 10 shows, the mask pattern 64 is removed, and a wet etching process is performed subsequently to remove the sacrificial layer 51 through the chamber 68 in order to form a hanged membrane structure 70 in the structural pattern 52. Please note that the front scribe lines 56 is filled with the filling layer 58, so as to effectively protect the front surface of the structural pattern 52 from etching solution damage in the wet etching process. As FIG. 11 shows, the filling layer 58 filled in the front scribe lines 56 is removed, for example by utilizing an organic solution or an oxygen plasma etc. to complete the cutting process.

Figure 12:
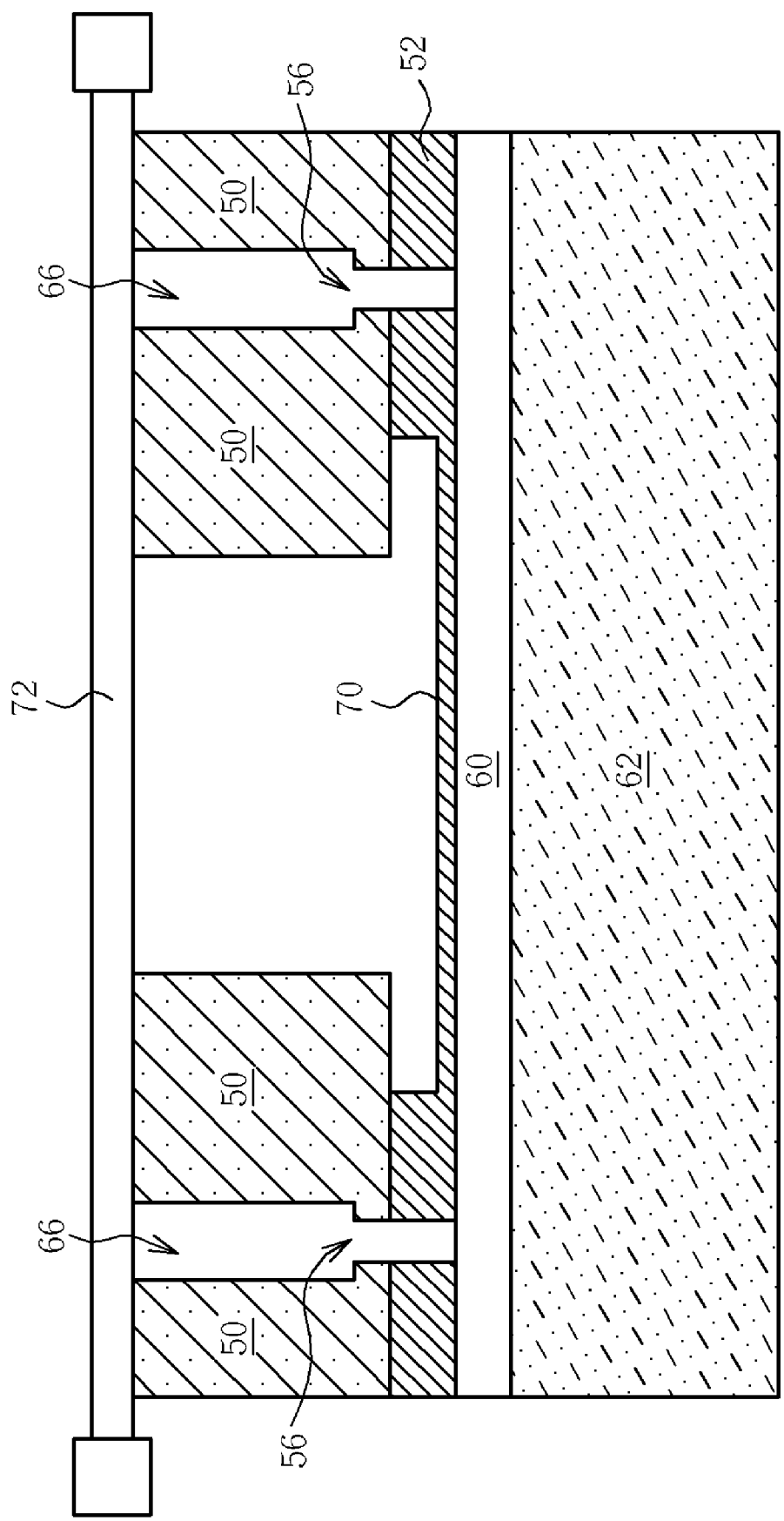
Figure 13:
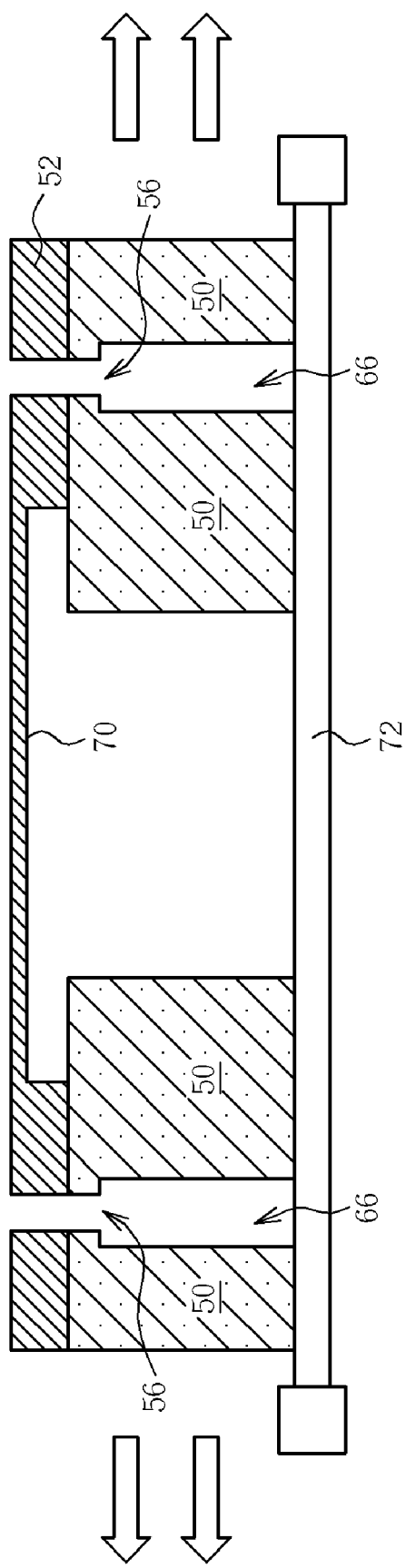

As FIG. 12 shows, an extensible tape 72 is attached, which is used for an expanded wafer, to the back surface of the wafer 50. As FIG. 13 shows, the bonding layer 60 is removed finally, and the extensible tape 72 is utilized to support and perform the continuous automatic wafer expansion and sorting processes. The method of removing the bonding layer 60 depends on the material of the bonding layer 60. For example, if the bonding layer 60 is a thermal releasing tape, it could be removed by heating, and if the bonding layer 60 is a UV tape, it could be removed by shooting UV rays.

In conclusion, performing the double-sided process of the present invention has the following advantages:

(1) High automation;

(2) Prevention of damage to the hanged membrane structure caused by the clean process and the cutting process;

(3) The filling layer filled in the front scribe lines provides the possibility of performing the back wet etching process;

(4) There are no other material layers on the hanged membrane structure, and the hanged membrane structure will therefore not be fractured due to stress.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of performing a double-sided process, the method comprising:
   providing a wafer, a front surface of the wafer comprising a structural pattern;
   defining a plurality of front scribe lines on the structural pattern;
   filling a filling layer into the front scribe lines;
   providing a carrier wafer, and bonding the structural pattern to the carrier wafer with a bonding layer;
   defining a plurality of back scribe lines on a back surface of the wafer;
   removing the filling layer filled in the front scribe lines;
   attaching an extensible tape to the back surface of the wafer after the step of removing the filling layer in the front scribe lines;
   removing the bonding layer; and
   performing an automatic wafer expansion and die sorting process.

2. The method of claim 1, wherein the front scribe lines are defined by a front etching process.

3. The method of claim 1, wherein the front scribe lines reach the wafer, but do not penetrate the wafer.

4. The method of claim 1, wherein the step of filling the filling layer into the front scribe lines comprises:
   forming the filling layer on the structural pattern, where the filling layer covers the surface of the structural pattern and fills into the front scribe lines; and
   removing the filling layer covering the surface of the structural pattern.

5. The method of claim 1, wherein the materials of the filling layer comprise photoresist, Benzocyclobutene (BCB), polyimide, or epoxy.

6. The method of claim 1, wherein the bonding layer comprises a thermal releasing tape or a UV tape.

7. The method of claim 1, wherein a plurality of hanged membrane structures are formed, when the back scribe lines are defined on the back surface of the wafer.

8. The method of claim 7, wherein the back scribe lines and the hanged membrane structures are defined by a back etching process.

9. The method of claim 8, wherein the back etching process is a plasma etching process.

10. The method of claim 8, wherein the back etching process is a wet etching process.

11. The method of claim 10, wherein the wet etching process utilizes potassium hydroxide (KOH) solution, ethylenediamine-pyrocatechol-water (EDP) solution, or tetramethyl ammonium hydroxide (TMAH) solution as an etching solution.

12. The method of claim 1, wherein the filling layer covering the surface of the structural pattern is removed by a wet etching process.

13. The method of claim 1, wherein the filling layer covering the surface of the structural pattern is removed by a dry etching process.

* * * * *